(12) United States Patent
Barth, Jr. et al.

(10) Patent No.: US 6,400,629 B1
(45) Date of Patent: Jun. 4, 2002

(54) SYSTEM AND METHOD FOR EARLY WRITE TO MEMORY BY HOLDING BITLINE AT FIXED POTENTIAL

(75) Inventors: John E. Barth, Jr., Williston; Harold Pilo, Underhill, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/896,746

(22) Filed: Jun. 29, 2001

(51) Int. Cl.$^7$ .................................................. G11C 7/00

(52) U.S. Cl. .................... 365/210; 365/190; 365/205

(58) Field of Search ................................. 365/190, 205, 365/207, 208, 210, 189.05

(56) References Cited

U.S. PATENT DOCUMENTS

| | | | |
|---|---|---|---|
| 4,677,592 A | 6/1987 | Sakurai et al. | 365/222 |
| 5,007,022 A | 4/1991 | Leigh | 365/189.04 |
| 5,339,274 A * | 8/1994 | Dhong et al. | 365/210 |
| 5,847,989 A * | 12/1998 | Seyyedy | 365/210 |
| 5,923,593 A | 7/1999 | Hsu et al. | 365/189.04 |
| 5,963,497 A | 10/1999 | Holland | 365/222 |
| 6,085,300 A | 7/2000 | Sunaga et al. | 711/168 |
| 6,208,574 B1 * | 3/2001 | Hardee | 365/205 |

FOREIGN PATENT DOCUMENTS

| | | |
|---|---|---|
| JP | 07-211068 | 8/1995 |
| JP | 11-086539 | 3/1999 |
| JP | 11-219585 | 8/1999 |

OTHER PUBLICATIONS

Patent Application YOR920000400, S/N 09/660,431 filed Sep. 12, 2000, entitled "Method and Apparatus for Refreshing Data in DRAM Cache Memory".

Patent Application YOR920000459, S/N 09/650,011 filed Aug. 28, 2000, entitled "Dual Port DRAM Architecture System".

IBM Technical Disclosure Bulletin, "Early Restore of Column Address Strobe for Dense Random–Access Memories in Page Mode", vol. 28, No. 8, Jan. 1986, pp. 3540–3541.

IBM Technical Disclosure Bulletin, "Transparent Refresh of Dynamic Random Access Memories", vol. 23, No. 7B, Dec. 1980, pp. 3201–3202.

* cited by examiner

*Primary Examiner*—Son Mai
(74) *Attorney, Agent, or Firm*—Daryl K. Neff

(57) ABSTRACT

A system and method is disclosed for writing early within a memory cycle by holding only one of a true bitline and a reference bitline at a fixed potential, e.g. ground, when the sense amplifier is set. The sense amplifier amplifies a small voltage difference between the true bitline and the reference bitline to predetermined high and low voltage logic levels to write a datum to the memory cell. In this way, writing can complete in about the same time as reading, without risking corruption of data on adjacent bitlines in the memory. The bitlines are precharged to a fixed potential in a conduction path through the bitswitches, rather than using local precharge devices at the sense amplifier. To write, bitswitches and write path transistors apply the fixed potential to one of the true bitline and the reference bitline. Bitswitches on such other memory cells not currently being written isolate the bitline pairs coupled to those memory cells when setting the sense amplifiers, such that the stored contents of such memory cells not being written are refreshed (written back) at the time that the selected memory cell is written.

26 Claims, 5 Drawing Sheets

SYSTEM AND METHOD FOR EARLY WRITE TO MEMORY BY HOLDING BITLINE AT FIXED POTENTIAL

FIELD OF THE INVENTION

This invention relates to integrated circuit memories and more specifically to an integrated circuit memory, especially a dynamic random access memory (DRAM), in which stored contents are sensed from small voltage signals present on bitlines.

BACKGROUND

Existing DRAMs are generally slower to access than static random access memory (SRAM) or read only memory (ROM). Conventionally, DRAMs have been manufactured as standalone independent integrated circuit chips which store large quantities of data for faster access than magnetic or optical disk media, at relatively low prices and low power consumption. SRAMs and ROMs, by contrast, have usually provided faster access than DRAMs, but often at higher prices and power consumption because these memory types require a larger device count per stored data bit, which adds to cost and density.

Recently, interest has increased in using DRAMs as one of several elements of an integrated circuit, e.g. a "system on a chip", which may also include logic or linear circuits or other circuit types. Such DRAM elements have been called embedded DRAM or "EDRAM". The goals of using embedded DRAM include obtaining potentially large amounts of easily rewriteable storage with fast access times but at lower cost and power consumption than SRAMs. One problem facing existing DRAMs is that it takes longer to write a memory cell with a new datum than it takes to read or refresh the datum in that memory cell. This problem is understood with reference to FIGS. 1 and 2. Specifically, FIG. 1 shows signals which are active when a prior art DRAM memory cell is being read. A read operation begins with the wordline voltage 10 rising from a quiescent value (in this case, about −0.4 volts) to an activated value which makes the access transistor of the memory cell conduct. Charge stored by a capacitor in the memory cell then begins to flow through the transistor on a bitline to a sense amplifier. At the sense amplifier a small voltage difference signal 11 develops between the voltage 12 on a bitline BT and the voltage 14 on a reference bitline BC which is not connected to the memory cell being read. The sense amplifier functions to convert a small swing, e.g. "analog" signal between the bitline BT and the reference bitline BC into a full swing logic level signal for storage to or transfer of the datum from the memory cell. After the small voltage signal 11 appears, the sense amplifier is set, i.e. triggered through a signal SETP 16, to amplify the small voltage signal 11 to full swing logic levels. This results in the bitline voltage 12 and the reference bitline voltage 14 separating from their initial small voltage difference to respective predetermined high and predetermined low logic levels, in this case about 1.2 V, and 0.0 V, respectively. The voltage stored in the memory cell is shown in FIG. 1 by curve 18.

By contrast, some write operations in conventional DRAMs take longer to perform than a read operation. With reference to FIG. 2, an operation to write a high logic level, i.e. a "1" in a memory cell that currently stores a low logic level, i.e. a "0" is known as "Read_0_Modify_Write_1." This write operation starts by reading the memory cell which contains a "0" and then forcing the memory cell to store the opposite value "1." The initial reading step is necessary to prevent the stored contents of memory cells on adjacent bitlines from becoming corrupted. While the one memory cell is being rewritten with a "1" from a "0" state, memory cells on other bitlines accessed by the same wordline are read and "written back" with the same data that they already store.

As shown in FIG. 2, the read_modify_write operation begins the same way as the read operation with the wordline voltage 10 rising from the quiescent value to an activated value. Charge stored by a capacitor in the memory cell then begins to flow through the transistor on a bitline to a sense amplifier, where a small voltage difference signal 21 develops between the voltage 22 on a bitline BT and the voltage 20 on a reference bitline BC which is not connected to the memory cell being written. After the small voltage signal 21 appears, the signal SETP 16 sets the sense amplifier, which results in the small voltage signal 21 being amplified into predetermined high and predetermined low logic levels on the reference bitline BC and the bitline BT, respectively, which reflect the original "0" value datum stored in the memory cell.

In the prior art DRAM operation shown in FIG. 2, the voltages 22, 20 on the bitline BT and reference bitline BC are forced to new levels only after the sense amplifier is set. After the sense amplifier is set, the voltages 20, 22 advance almost fully towards the high and low logic levels, respectively. Then, the bitline and reference bitline voltages reverse course to reach the opposite levels as required by the write operation.

The time required to perform the initial read before writing makes the voltage 24 in the memory cell take longer to rise than in the read operation. In comparison to the read operation shown in FIG. 1, in the read_modify_write operation, the memory cell voltage takes about 30% longer to rise to 90% of final value than it does in the read operation, as evident from comparing the intervals t0–t1 of FIG. 1 with t0'–t1' of FIG. 2.

Heretofore, the longer time to perform the read_modify_write operation has been considered acceptable. This is because forcing bitline signal levels to new values too soon could potentially corrupt data in other memory cells due to line to line noise coupling between the bitline being written and an adjacent bitline. Heretofore, there has not been a way to quickly write a memory cell with a new value without risking corruption of data in memory cells which are accessed by adjacent bitlines.

SUMMARY

Accordingly, among objects of the invention, each of which may operate in the alternative to, or in conjunction with other objects, are the following:

An object of the invention is to perform a write operation to a memory cell in about as little time as a read operation.

Another object of the invention is to quickly perform a write operation to a memory cell without risking corruption of data in memory cells accessed by adjacent bitlines.

Another object of the invention to provide a system in which precharging is performed in a conduction path through bitswitches coupled to the primary sense amplifiers.

Still another object of the invention is to perform a write operation by holding only one of a true bitline and a reference bitline at a fixed potential and setting a sense amplifier to amplify a small voltage difference between the true and reference bitlines into predetermined high and low logic levels for storing a datum into a memory cell.

Accordingly, in an aspect of the present invention, an integrated circuit including a memory is provided which is adapted to write a datum to a memory cell by bitswitches which hold only one of a true bitline and a reference bitline at a fixed potential when a sense amplifier is set, the sense amplifier being adapted to amplify a small voltage difference between the true and reference bitlines to a predetermined high voltage and a predetermined low voltage. The true bitline is then at one of the predetermined high voltage and the predetermined low voltage, and that voltage is transferred to the memory cell to write the datum.

In a more preferred aspect of the invention, the memory cell being written and other memory cells are accessed by a wordline. Bitswitches on such other memory cells not currently being written are adapted to isolate true and reference bitlines coupled to those memory cells when sense amplifiers coupled to those bitlines are set, such that the stored contents of such memory cells not being written are refreshed at the time that the selected memory cell is written.

DETAILED DESCRIPTION OF THE PREFERRED EMBODIMENTS

Figure 1:
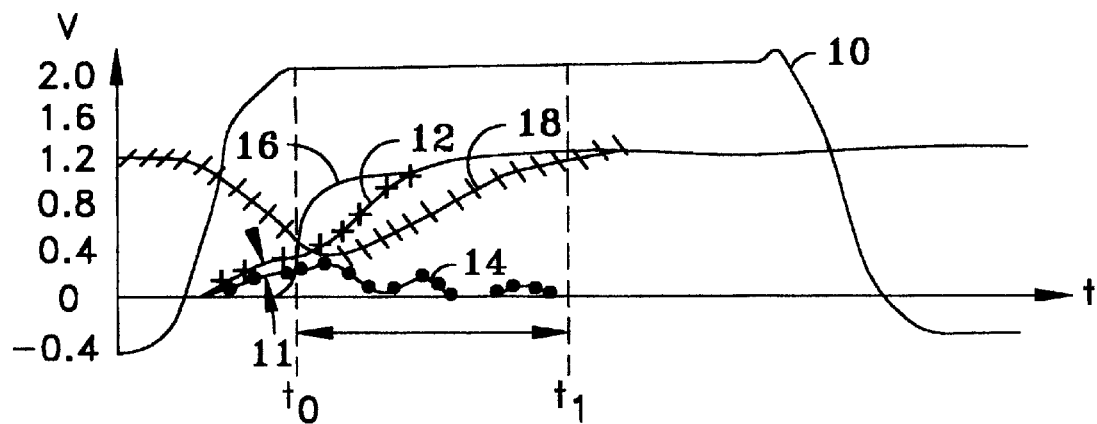
FIGS. 1 and 2 are timing diagrams illustrating prior art read and read_modify_write operations, respectively.
Figure 2:
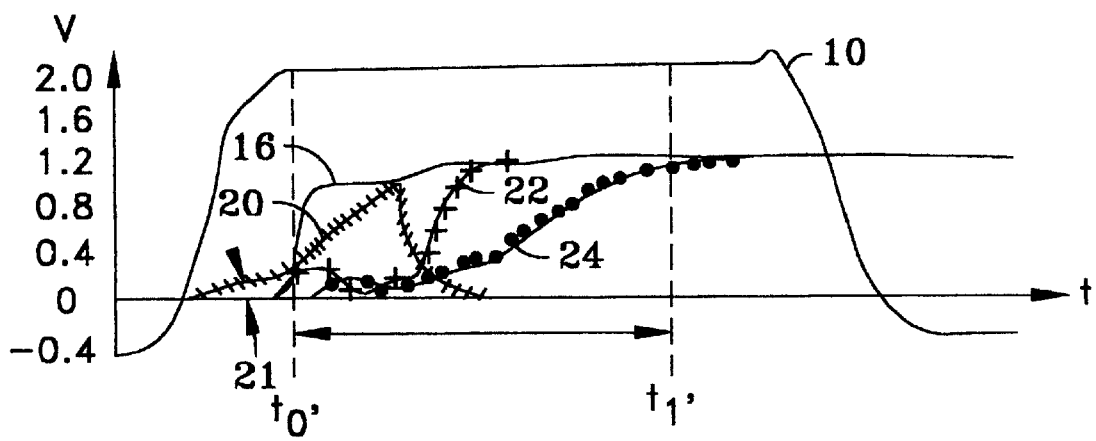

The present invention provides a system and method of writing a datum to a memory cell by holding only one of a true bitline and a reference bitline, i.e. complementary bitline, at a fixed potential, for example ground, when the sense amplifier is set. Thus, in the steps of the method in order, the true bitline and reference bitline are precharged to a fixed potential. Then, to write, one of the true bitline and the reference bitline is held at the fixed potential. After the wordline is activated, a small voltage difference appears between the true and reference bitlines. The sense amplifier is then set, which amplifies the small voltage difference to a full swing signal being a predetermined high voltage (Vdd) on one of the true bitline and the reference bitline and a predetermined low voltage (ground) on the other one. The memory cell is written by storing the high voltage or the low voltage which is present on the true bitline.

The invention also provides a novel way to precharge the true and reference bitlines without using precharge devices located at the primary sense amplifiers. Instead, precharging is performed by turning on bitswitches connected to a fan-in arrangement, at a time when devices therein are connected to a precharge potential such as ground. Thus, the bitswitches provide a conduction path for precharging the bitlines.

Thus, in such a system in which the true and reference bitlines are initially precharged to ground, a low voltage level (ground) is stored to a memory cell as a "0" in the following manner. The wordline is activated. The true bitline is held at ground while an above ground reference potential appears on the reference bitline, by for example, transferring charge from a reference cell in which a Vdd/2 voltage has been stored. A small voltage difference develops between the true bitline and the reference bitline. The sense amplifier is then set, which amplifies the small voltage difference to a full swing signal being a predetermined low voltage, i.e. ground, on the true bitline, and a predetermined high voltage (Vdd) on the reference bitline. The memory cell is written with the low voltage present on the true bitline to write the "0".

In a read operation, the true bitline and the reference bitline are initially precharged to ground. The wordline is activated and a small voltage difference signal develops on the true and reference bitlines based on charge transfer from the memory cell onto the true bitline and a reference potential that appears on the reference bitline. A reference potential is provided on the reference bitline by, for example, transfer of charge from a reference cell onto the reference bitline, the reference cell storing an intermediate voltage such as Vdd/2. The sense amplifier is then set which amplifies the small voltage difference signal to a full swing signal being a predetermined high voltage (Vdd) on one of the true bitline and the reference bitline, and a predetermined low voltage (ground) on the other one.

Figure 3:
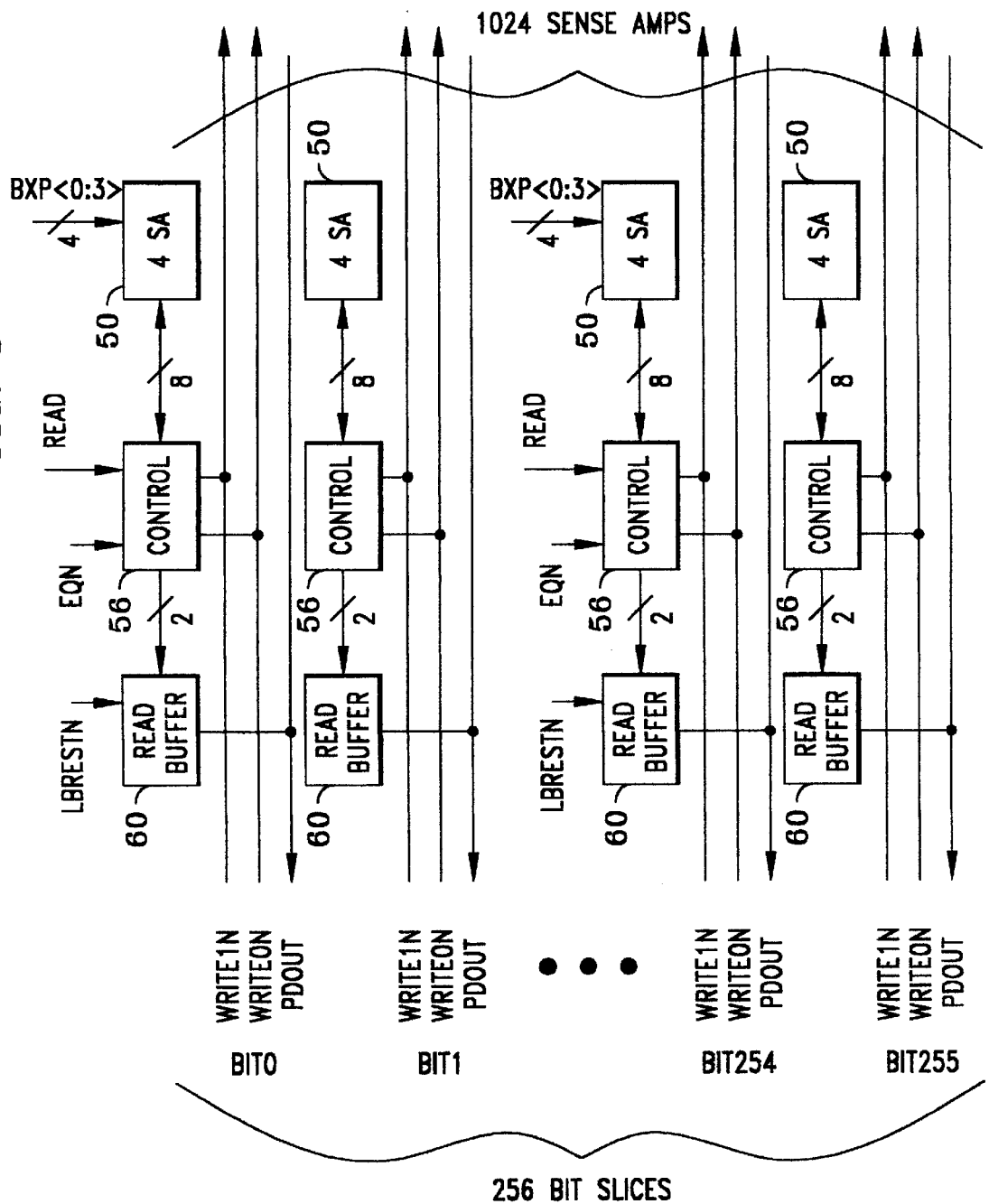
FIGS. 3, 4A and 4B are diagrams showing circuitry of a preferred embodiment of the invention.

In the embodiments described in the following, in a write operation, a bitswitch pair controls which pair among a plurality of pairs, e.g. four pairs, will have one of the true bitline and the reference bitline held at the fixed potential when setting the sense amplifier. FIG. 3 is a block diagram of input/output circuitry associated with a memory array in which a 256 wide I/O path is provided from 1024 primary sense amplifiers by a one-of- four fan-in arrangement. With reference to FIG. 3, bitswitches operated by on/off signals BXP<0:3> within each group 50 of four primary sense amplifiers control the signal flow during a read operation on the true bitline and the reference bitline from a primary sense amplifier group 50 to a read buffer 60. Bitswitches also select which one of four bitline pairs is to be written during a write operation by providing a conducting path to a fixed potential, e.g. ground, for one of the true bitline and reference bitline, such that the fixed potential is present at the primary sense amplifier when it sets. Each read buffer 60 has one true fan node and one complement fan node which are coupled by four pairs of bitswitches to one of four true bitlines and to one of four reference bitlines in group 50, respectively. For each four pairs of bitswitches, one pair is turned on at a time by signals BXP<0:3> to permit signal flow onto the true bitline and reference bitline during a write operation, and away from the true bitline and reference bitline to the read buffer during a read operation. Control block 56 is provided between the primary sense amp group 50 and the read buffer 60 to control read and write operations based on the inputs READ, EQN, WRITEON and WRITEIN.

Figure 4A:
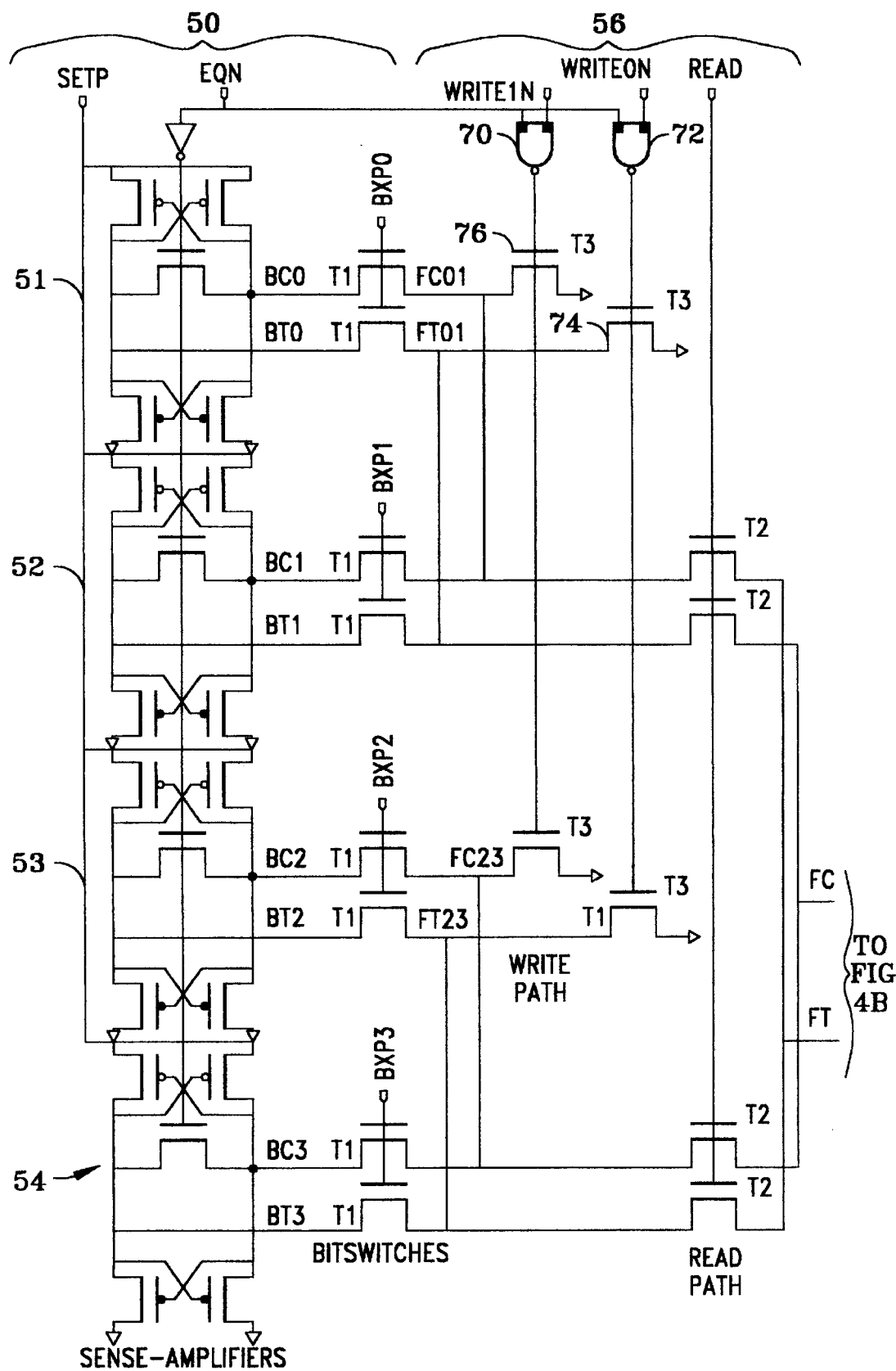
Figure 4B:
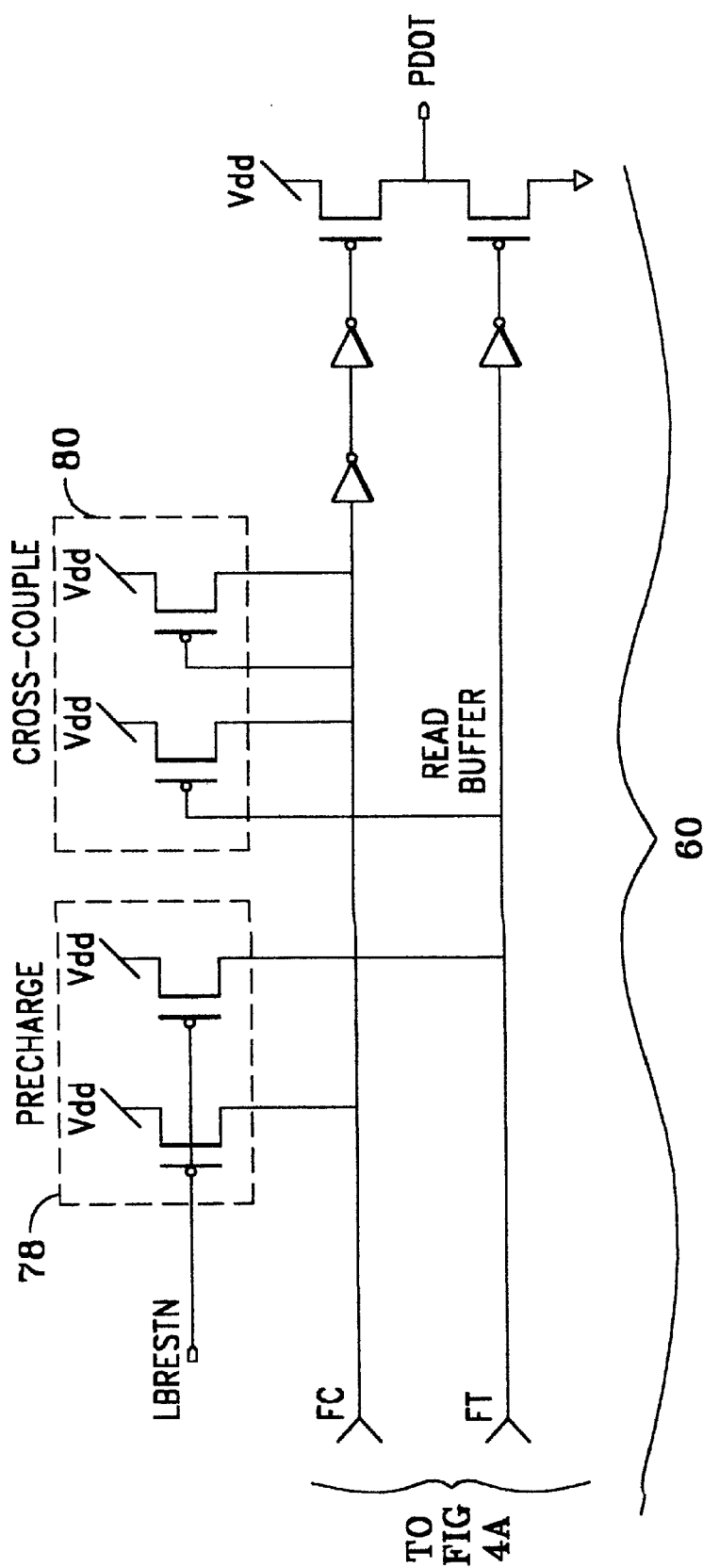

FIG. 3, 4A and 4B are based on a one-of-four fan-in arrangement in which data read from only one of the four primary sense amplifiers in a group 50 is provided to a read buffer 60 in one read operation. Those skilled in the art will understand the trivial modifications required to make a one-of-eight fan-in arrangement for a 256 wide I/O path using 2048 primary sense amplifiers, and to increase or reduce the number of primary sense amplifiers to each fan-in node, as desired for a particular design. It will also be understood that the width of the I/O path is merely a matter of design choice, and is shown only exemplarily here as 256 bits wide. It will also be understood the manner in which, in an alternative arrangement, the read buffers 60 may be shared between upper and lower subarrays. Only input output circuitry for an upper subarray is shown in FIG. 3.

FIGS. 4A and 4B are schematic diagrams showing primary sense amplifiers 51, 52, 53, 54, four pairs of a true bitline and reference bitline respectively coupled thereto as BT0, BC0; BT1, BC1; BT2, BC2; and BT3, BC3, bitswitch pairs T1, one pair coupled to each bitline pair and operated by signals BXP0 . . . 3 as shown, and a read buffer 60. A control block 56 includes transistors T2, turned on when the READ signal goes high, which provide a conducting path during a read operation between two bitline pairs and a pair of a true fan node FT and complement fan node FC, respectively. Control block 56 also includes write path transistors T3, only one of which is turned on at a time to write to any pair of bitlines, e.g. BT0, BC0. During a write operation, the write path transistors T3 provide a conducting path only between a selected one of the true bitline and reference bitline to a fixed potential. During a precharge operation, the write path transistors T3 of each pair are both turned on, as well as bitswitches T1, to precharge the bitlines to a fixed potential. When it is desired to mask a particular primary sense amp group 50 during a write operation, write masking is performed by turning off both of the write path transistors T3. As shown in FIGS. 4A and 4B, the fixed potential is ground. However, as will be described more fully below, in an alternate arrangement the fixed potential can be Vdd, which is the predetermined high voltage at which a high logic level or "1" is written to the memory cell.

Two pairs of bitlines, e.g. BT0 . . . BT1 are conductively connected as intermediate fan nodes FT01, FC01 such that each read path transistor T2 and each write path transistor T3 provides a shared conduction path for two true bitlines or two reference bitlines. Two other pairs BT2 . . . BT3 are conductively connected as intermediate fan nodes FT23, FC23 in the same configuration. By such sharing, the device count in control block 56 is reduced.

Write signal control is provided by NAND gates 70, 72 which provide on/off signals to write path transistors T3. When a "0" is to be written to the memory cell accessed by bitline BT0, the T3 transistor 74 is turned on by a low-going WRITEON pulse at NAND 72. This signal grounds BT0 when the bitswitch pair (transistors T1) is turned on by the BXP0 signal such that when the sense amplifier sets, BT0 is held at ground and BC0 is driven to a predetermined high voltage, i.e. Vdd. When a "1" is to be written to the memory cell accessed by bitline BT0, the T3 transistor 76 is turned on by a low-going WRITEIN pulse at NAND 70. This action grounds BC0 when the bitswitch pair (transistors T1) is turned on by the BXP0 signal, such that when the sense amplifier sets, BC0 is held at ground and BT0 is driven to a predetermined high voltage, i.e. Vdd.

NAND gates 70, 72 and write path transistors T3 also control precharge operation. In this embodiment, all bitlines and intermediate fan nodes are precharged to ground. During precharge, the bitswitch signals BXP0 . . . 3 turn the T1 bitswitches on and a lowgoing equalization signal EQN is transferred through NAND gates 70, 72 to turn on all T3 transistors, thereby discharging the intermediate fan nodes and bitlines to ground. In this way, precharge devices need not be located locally at sense amplifiers 51 . . . 54, and the same transistors T3 are used both for precharging and for write data control.

The read buffer 60 contains devices 78 which precharge the fan nodes FT and FC to Vdd upon application of signal LBRESTN. A pair of cross-coupled devices 80, preferably PFETs as shown, operate to differentiate and maintain voltages on the fan nodes FT and FC at respective ones of predetermined high and low voltages. Data from the read operation is output from the fan nodes at terminal PDOT.

Figure 5:
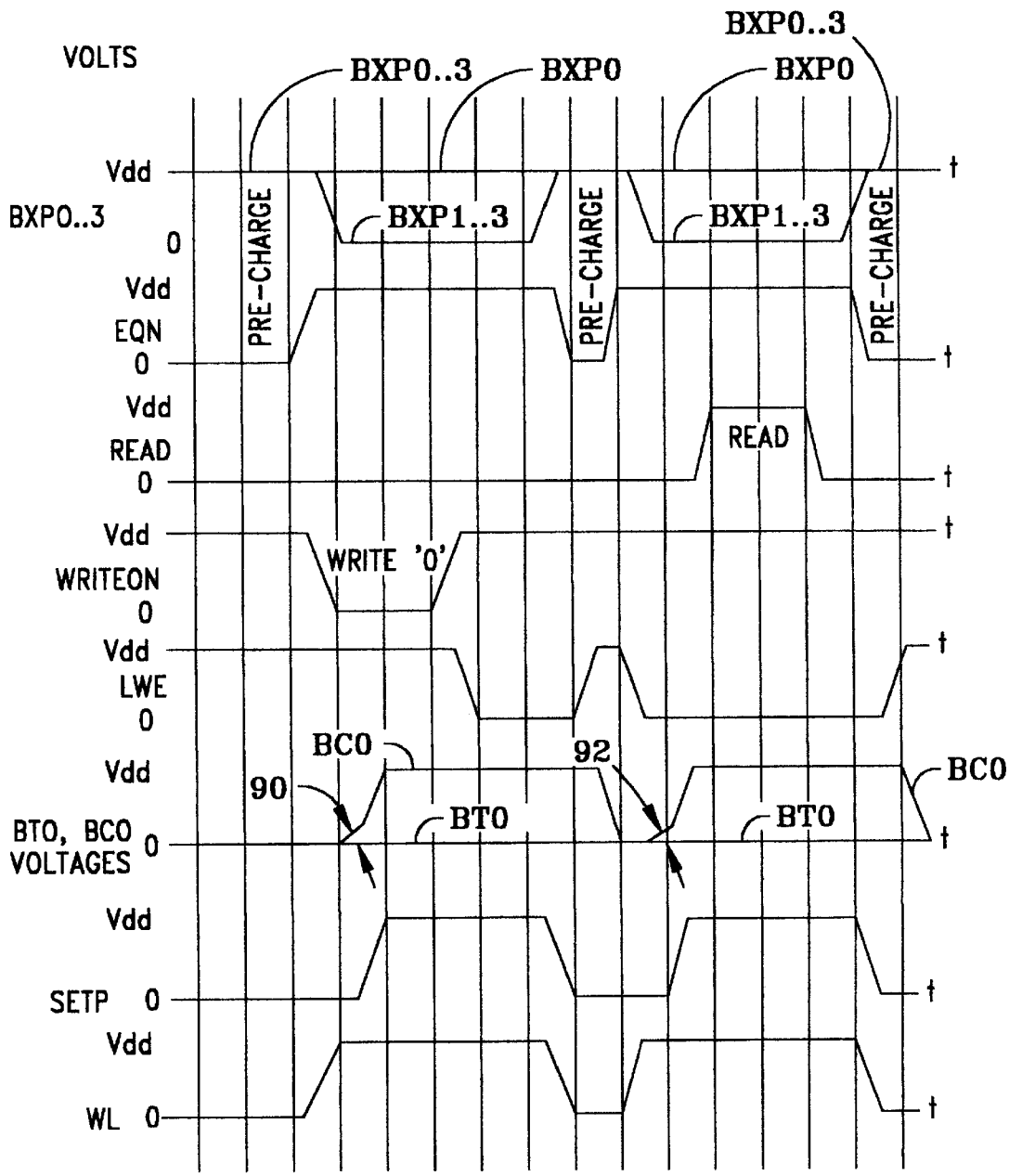
FIG. 5 is a timing diagram illustrating write and read operations of a preferred embodiment of invention.

With reference to FIG. 5, operations are as follows. Beginning with a write operation, the bitlines and intermediate fan nodes are precharged to ground by turning on the T1 bitswitches with BXP0 . . . 3 signals high and the EQN signal low. The T3 transistors turn on, thereby discharging the intermediate fan nodes and the bitlines to ground. After precharging, EQN goes high again.

Writing a "0" to a memory cell accessed by true bitline BT0 is performed as follows. Write control signal WRITEON goes low at NAND gate 72, turning on only T3 write path transistor 74 to ground. In this example, signal LWE (local write enable) represents the output of NAND gate 72. LWE, when high, turns on T3 transistor 74. The pair of T1 bitswitches controlled by BXP0 remain turned on, while other bitswitches BX1 . . . BXP3 are turned off, such that only the true bitline BT0 is held at ground.

The wordline is activated by WL going high, thereby connecting the true bitline BT0 to the memory array. At this time, the reference bitline BC0 is also provided a reference potential which is above ground. This is preferably provided from a Vdd/2 voltage stored in a reference cell, the reference cell being accessed by a reference wordline activated at the same time as the array wordline. A small voltage difference 90 develops between bitlines BT0 and BC0. The primary sense amplifier 51 is then set by signal SETP going high. Since bitline BT0 is held at ground, the signal on BC0 is driven to a predetermined high voltage Vdd while BT0 remains at ground. The bitswitches T1 controlled by BXP0 remain on while the wordline remains activated to write a predetermined low voltage, i.e. ground, as a "0" datum to the memory cell. At the end of the write operation, the wordline activation voltage WL falls again, as does SETP to reset the sense amplifier.

If this had been an operation to write a "1" to a memory cell 0 accessed by bitline BT0, WRITEON would have remained high and instead, a low-going WRITE IN pulse would have been provided. NAND 70 and T3 transistor 76 (now turned on) would then clamp reference bitline BC0 at ground. After wordline activation (WL going high), the sense amplifier would then be set by SETP, and the voltage on BC0 would remain clamped at ground. The voltage on the true bitline BT0 would be driven to the predetermined high voltage Vdd by the primary sense amplifier 51. The predetermined high voltage would be stored to the memory cell as a "1" from the high voltage on true bitline BT0. SETP and WL would then fall again, completing the write operation.

Next, as shown in FIG. 5, precharge to ground is then performed again in the same way as before, with the bitswitches T1 turned on by BXP0 . . . 3 going high, and EQN going low to discharge the bitlines and the intermediate fan nodes to ground through transistors T3.

It will be understood from the foregoing that the write operation on one bitline, e.g. bitline BT0, occurs at the same time, and in about as little time as a refresh (writeback) operation on other bitlines which are coupled to the same activated wordline. The bitlines BT0 . . . BT3 are coupled to memory cells which are all accessed by the same wordline. When a particular memory cell 0 on bitline BT0 is being written with a new datum, the data in memory cells on other bitlines BT1 . . . BT3 are refreshed, that is written back. When the wordline is activated (by WL going high), the charge stored in all the memory cells along that wordline flows onto the bitlines to sense amplifiers. Thus, upon wordline activation, signals representing stored data travel from memory cells on bitlines BT0 . . . BT3 to primary sense amplifiers 51 . . . 54, respectively.

In a usual write operation such as this one, only the memory cell on bitline BT0 is written because only the BXP0 bitswitch pair is turned on at the time. The memory cells on bitlines BT1 . . . BT3 are not written but instead written back because the BXP1 . . . BXP3 bitswitch pairs are then off. Thus, the BXP 1 . . . BXP3 bitswitches isolate the bitline pairs BT1, BC1, etc. in each case in each group 50 (FIG. 3) when the datum on another bitline, e.g. BT0 is being written. In this way, primary sense amplifiers 52 . . . 54 receive the stored data signals from the bitlines coupled thereto and regenerate the data signals to predetermined high and low logic levels, these levels being stored again to the memory cells (writeback function).

From the foregoing, it will be understood that a new function is made possible by the invention, if the bitswitches are controlled differently. By turning on two or more bitswitch pairs at a time during a write operation, the invention provides a way to "block write" the same datum simultaneously into two or more memory cells accessed by primary sense amp group 50, thus reducing the number of write operations required to write to the memory cells on the same wordline. This might be desired to quickly write a repetitive pattern or to perform a blanking function to a memory array.

Next, a read operation from memory cell 0 is performed using a true bitline BT0 and a reference bitline BC0. Only signal BXP0 remains high after precharge to keep the T1 bitswitches on bitlines BT0 and BC0 turned on while the other bitswitch pairs are turned off by BXP1 . . . 3 going low. The wordline is activated by WL going high and a small voltage difference signal 92 develops between the true bitline BT0 and the reference bitline BC0. The primary sense amplifier 51 is then set by signal SETP going high, thereby differentiating the voltages on BT0 and BC0 to the predetermined low and high voltages, ground and Vdd, respectively. The read path transistors T2 are kept turned off when the primary sense amplifier (51 in this case) is amplifying the voltage difference 92. This minimizes loading on the primary sense amplifier and potential signal degradation which would otherwise arise from the additional capacitance of bitline pairs in group 50 and from the read buffer 60. After signal amplification, with the voltages on BT0 and BC0 now differentiated, the READ signal going high turns on read path transistors T2, thereby transferring the bitline signals between BT0 and FT, and between BC0 and FC of read buffer 60. At the read buffer 60, the fan node voltages FT and FC now represent the datum read from memory cell 0 on bitline BT0. The signal transfer is assisted by cross-coupled devices 80 which act to keep the voltages at fan nodes FT and FC at respective ones of Vdd and ground. The datum is provided as output on PDOT. Thus, the read operation is now fully described.

It will be understood that one ordinarily skilled in the art could, with trivial modifications, alter the arrangement described with reference to FIGS. 3–5 in such way that the bitlines are precharged to a predetermined high voltage, Vdd, instead of ground. In such modified arrangement, one of the true bitline and reference bitline would be held at Vdd during the write operation, while a lower reference potential appears on the reference bitline, by for example, transferring charge from a reference cell in which a Vdd/2 voltage has been stored. Similar to the arrangement of FIGS. 3–5, control would be effected through a bitswitch left on after the Vdd precharge, and through a write path transistor to connect the selected true bitline or reference bitline to Vdd.

For example, when writing a "1" to the memory cell, the true bitline is held at Vdd with the bitswitch left on and the write path transistor active. A small voltage difference appears between the true bitline and the reference bitline, such that, when the sense amplifier is set, the true bitline remains at Vdd, while the reference bitline is driven to a predetermined low voltage such as ground. The memory cell is then written with the predetermined high voltage Vdd which is present on the true bitline.

While the invention has been described with reference to certain preferred embodiments thereof, those skilled in the art will understand the many modifications and enhancements which can be made without departing from the true scope and spirit of the invention as claimed in the appended claims.

We claim:

1. An integrated circuit of the type including a memory having a memory array, the memory array including a memory cell having a true bitline coupled thereto, and a reference bitline, and further including a sense amplifier coupled to said true bitline and to said reference bitline, said sense amplifier adapted to amplify a small voltage difference between said true bitline and said reference bitline to a full swing signal being a predetermined high voltage and a predetermined low voltage for transfer to and from said memory cell, said full swing signal having a voltage difference which is much greater than said small voltage difference, said integrated circuit further comprising:

first and second bitswitches adapted to hold only one of said true bitline and said reference bitline at a fixed potential prior to amplification by said sense amplifier during a write operation, while a small voltage difference develops between said true bitline and said reference bitline, whereby, to write a datum to said memory cell, said sense amplifier amplifies said small voltage difference to said full swing signal, one of said predetermined high voltage and said predetermined low voltage being on said true bitline, and the other one of said predetermined high voltage and said predetermined low voltage being on said reference bitline.

2. The integrated circuit of claim 1 wherein, during a read operation, said first bitswitch and said second bitswitch are adapted to isolate said true bitline and said reference bitline such that said sense amplifier amplifies a small voltage difference between said true bitline and said reference bitline to read a stored datum stored in said memory cell.

3. The integrated circuit of claim 2 further comprising a true fan node and a complement fan node, said true fan node and said complement fan node selectively coupled to said true bitline and said reference bitline by said first bitswitch and said second bitswitch, respectively, to store a datum read from or to be written to said memory cell, wherein said first bitswitch is adapted to hold said true bitline at said fixed potential by being conducting when said true fan node is held at said fixed potential, and said second bitswitch is adapted to hold said reference bitline at said fixed potential by being conducting while said complement fan node is held at fixed potential.

4. The integrated circuit of claim 3 further comprising first and second write control switches, wherein said true fan node is selectively held at said fixed potential being a voltage above ground by said first write control switch when storing said predetermined high voltage to said memory cell, and said complement fan node is selectively held at said fixed potential by said second write control switch when storing said predetermined low voltage to said memory cell.

5. The integrated circuit of claim 4 wherein said first and said second bitswitches are adapted to precharge said true bitline and said reference bitline to said fixed potential by being conducting while said first and said second write control switches hold said true fan node and said complement fan node to said fixed potential.

6. The integrated circuit of claim 5 further comprising a pair of cross-coupled devices coupled to said true fan node and said complement fan node during a read operation, said cross-coupled devices responsive only during said read operation, to hold said true fan node and said complement fan node at different ones of said predetermined high voltage and said predetermined low voltage.

7. The integrated circuit of claim 2, said memory cell being a first memory cell, said sense amplifier being a first sense amplifier, said true bitline being a first true bitline, said reference bitline being a first reference bitline, said memory array further including a second memory cell, a wordline coupled to said first and to said second memory cells, a second true bitline coupled to said second memory cell, and a second reference bitline, a second sense amplifier coupled to said second true bitline and to said second reference bitline, and third and fourth bitswitches coupled to said second true bitline and to said second reference bitline, respectively, wherein said first and said second bitswitches selectively hold one of said first true bitline and said first reference bitline at said fixed potential, respectively, prior to amplification by said first sense amplifier during a write operation at the same time that said third and said fourth bitswitches isolate said second true bitline and said second reference bitline, whereby said write datum is written to said first memory cell in the same operation that a stored datum stored in said second memory cell is refreshed.

8. An integrated circuit of the type including a memory having a memory array, the memory array including a memory cell having a true bitline coupled thereto, and a reference bitline, and further including a sense amplifier coupled to said true bitline and to said reference bitline, said sense amplifier adapted to amplify a small voltage difference between said true bitline and said reference bitline to a full swing signal being a predetermined high voltage and a predetermined low voltage for transfer to and from said memory cell, said full swing signal having a voltage difference which is much greater than said small voltage difference, said integrated circuit further comprising:

first and second bitswitches adapted to ground only one of said true bitline and said reference bitline prior to amplification by said sense amplifier during a write operation, while a small voltage difference develops between said grounded one and said other ungrounded one of said true bitline and said reference bitline, whereby, to write a datum to said memory cell, said sense amplifier amplifies said small voltage difference to said full swing signal, one of said predetermined high voltage and said predetermined low voltage being on said true bitline, and the other one of said predetermined high voltage and said predetermined low voltage being on said reference bitline.

9. The integrated circuit of claim 8 wherein, during a read operation, said first bitswitch and said second bitswitch are adapted to isolate said true bitline and said reference bitline such that said sense amplifier amplifies a small voltage difference between said true bitline and said reference bitline to read a stored datum stored in said memory cell.

10. The integrated circuit of claim 9 further comprising a true fan node and a complement fan node, said true fan node and said complement fan node selectively coupled to said true bitline and said reference bitline by said first bitswitch and said second bitswitch, respectively, to store a datum read from or to be written to said memory cell, wherein said first bitswitch is adapted to ground said true bitline by being conducting when said true fan node is grounded, and said second bitswitch is adapted to ground said reference bitline by being conducting while said complement fan node is grounded.

11. The integrated circuit of claim 10 further comprising first and second write control switches, wherein said true fan node is selectively grounded by said first write control switch when storing said predetermined low voltage to said memory cell, and said complement fan node is selectively grounded by said second write control switch when storing said predetermined high voltage to said memory cell.

12. The integrated circuit of claim 11 wherein said first and said second bitswitches are adapted to precharge said true bitline and said reference bitline to ground by being conducting while said first and said second write control switches ground said true fan node and said complement fan node.

13. The integrated circuit of claim 12 further comprising a pair of cross-coupled devices coupled to said true fan node and said complement fan node during a read operation, said cross-coupled devices responsive only during said read operation, to hold said true fan node and said complement fan node at different ones of said predetermined high voltage and said predetermined low voltage.

14. The integrated circuit of claim 9, said memory cell being a first memory cell, said sense amplifier being a first sense amplifier, said true bitline being a first true bitline, said reference bitline being a first reference bitline, said memory array further including a second memory cell, a wordline coupled to said first and to said second memory cells, a second true bitline coupled to said second memory cell, and a second reference bitline, a second sense amplifier coupled to said second true bitline and to said second reference bitline, and third and fourth bitswitches coupled to said second true bitline and to said second reference bitline, respectively, wherein said first and said second bitswitches selectively ground one of said first true bitline and said first reference bitline, respectively, prior to amplification by said first sense amplifier during a write operation at the same time that said third and said fourth bitswitches isolate said second true bitline and said second reference bitline, whereby said write datum is written to said first memory cell in the same operation that a stored datum stored in said second memory cell is refreshed.

15. In an integrated circuit, a method of writing a datum to a memory cell of a memory array, said memory cell storing a datum accessed by a wordline and a true bitline coupled to said memory cell, said memory cell coupled to a sense amplifier by said true bitline , said sense amplifier adapted to differentiate a small voltage signal between said true bitline and a reference bitline to a full swing signal being a predetermined high voltage on one of said true bitline and said reference bitline and a predetermined low voltage on another one of said true bitline and said reference bitline, said small voltage signal having much smaller signal swing than said full swing signal, said method comprising:

activating said wordline, such that a small voltage signal appears on said true bitline and said reference bitline;

prior to setting said sense amplifier to differentiate said small voltage signal, and responsive to write input, grounding only one of said true bitline and said reference bitline; and thereafter setting said sense amplifier, whereby a datum is written to said memory cell, said datum having a value according to which one of said true bitline and said reference bitline is grounded.

16. The method of claim 15 further comprising, after activating said wordline and responsive to read input, isolating said true bitline and said reference bitline and thereafter setting said sense amplifier, such that a stored datum is read from said memory cell.

17. The method of claim 16 further comprising coupling said true bitline and said reference bitline to a true fan node and a complement fan node by first and second bitswitches, respectively, such that said one of said true bitline and said reference bitline is grounded when a corresponding one of said true fan node and said complement fan node is grounded while said first and said second bitswitches are conducting.

18. The method of claim 17 further comprising precharging both said true fan node and said complement fan node to ground prior to activating said wordline.

19. The method of claim 18 further comprising, after setting said sense amplifier, using cross-coupled devices to hold said true fan node and said complement fan node at different ones of said predetermined high voltage and said predetermined low voltage.

20. The method of claim 19 wherein said memory array further comprises a second memory cell, said second memory cell storing a datum accessed by said wordline and a second true bitline coupled to said second memory cell, said second memory cell coupled to a second sense amplifier by said second true bitline, said second sense amplifier adapted to differentiate a small voltage signal between said second true bitline and a second reference bitline to a full swing signal being a predetermined high voltage on one of said second true bitline and said second reference bitline and a predetermined low voltage on another one of said second true bitline and said second reference bitline, said small voltage signal having much smaller signal swing than said full swing signal, said method further comprising:

after activating said wordline, isolating said second true bitline and said second reference bitline, and thereafter setting said second sense amplifier simultaneously with said first sense amplifier, such that a stored datum stored in said second memory cell is refreshed while said datum is written to said first memory cell.

21. In an integrated circuit, a method of writing a datum to a memory cell of a memory array, said memory cell storing a datum accessed by a wordline and a true bitline coupled to said memory cell, said memory cell coupled to a sense amplifier by said true bitline , said sense amplifier adapted to differentiate a small voltage signal between said true bitline and a reference bitline to a full swing signal being a predetermined high voltage on one of said true bitline and said reference bitline and a predetermined low voltage on another one of said true bitline and said reference bitline, said small voltage signal having much smaller signal swing than said full swing signal, said method comprising:

activating said wordline, such that a small voltage signal appears on said true bitline and said reference bitline;

prior to setting said sense amplifier to differentiate said small voltage signal, and responsive to write input, grounding only one of said true bitline and said reference bitline; and thereafter setting said sense amplifier, whereby a datum is written to said memory cell, said datum having a value according to which one of said true bitline and said reference bitline is grounded.

22. The method of claim 21 further comprising, after activating said wordline and responsive to read input, isolating said true bitline and said reference bitline and thereafter setting said sense amplifier, such that a stored datum is read from said memory cell.

23. The method of claim 22 further comprising coupling said true bitline and said reference bitline to a true fan node and a complement fan node by first and second bitswitches, respectively, such that said one of said true bitline and said reference bitline is grounded when a corresponding one of said true fan node and said complement fan node is grounded while said first and said second bitswitches are conducting.

24. The method of claim 23 further comprising precharging both said true fan node and said complement fan node to ground prior to activating said wordline.

25. The method of claim 24 further comprising, after setting said sense amplifier, using cross-coupled devices to hold said true fan node and said complement fan node at different ones of said predetermined high voltage and said predetermined low voltage.

26. The method of claim 25 wherein said memory array further comprises a second memory cell, said second memory cell storing a datum accessed by said wordline and a second true bitline coupled to said second memory cell, said second memory cell coupled to a second sense amplifier by said second true bitline, said second sense amplifier adapted to differentiate a small voltage signal between said second true bitline and a second reference bitline to a full swing signal being a predetermined high voltage on one of said second true bitline and said second reference bitline and a predetermined low voltage on another one of said second true bitline and said second reference bitline, said small voltage signal having much smaller signal swing than said full swing signal, said method further comprising:

after activating said wordline, isolating said second true bitline and said second reference bit line, and thereafter setting said second sense amplifier simultaneously with said first sense amplifier, such that a stored datum stored in said second memory cell is refreshed while said datum is written to said first memory cell.

* * * * *